United States Patent [19]

Erickson et al.

[11] Patent Number: 4,547,746

[45] Date of Patent: Oct. 15, 1985

[54] VSWR TOLERANT LINEAR POWER AMPLIFIER

[75] Inventors: Alan R. Erickson, Marion; Marvin W. Heidt, Cedar Rapids, both of Iowa

[73] Assignee: Rockwell International Corporation, El Segundo, Calif.

[21] Appl. No.: 597,993

[22] Filed: Apr. 9, 1984

[51] Int. Cl.⁴ ............................................... H03G 3/20
[52] U.S. Cl. ................................ 330/298; 330/207 P; 330/279; 330/129
[58] Field of Search ............ 330/127, 129, 130, 207 P, 330/279, 285, 297, 298; 455/117

[56] References Cited

U.S. PATENT DOCUMENTS

| | | | |
|---|---|---|---|
| 3,449,680 | 6/1969 | Schilb et al. | 330/298 |
| 3,641,451 | 2/1972 | Hollingsworth et al. | 330/279 X |
| 4,165,493 | 8/1979 | Harrington | 330/207 P |
| 4,320,350 | 3/1982 | Drapac | 330/297 X |

Primary Examiner—Eugene R. LaRoche
Assistant Examiner—Steven J. Mottola
Attorney, Agent, or Firm—George A. Montanye; H. Fredrick Hamann

[57] ABSTRACT

There is disclosed a power amplifier which is useful in broadband systems having load impedances with VSWRs up to a range of 2:1 or 2.5:1. The power amplifier is constructed to change its operating conditions to match the load as presented at the output of the amplifier and is particularly useful in systems employing frequency hopping requiring broadband construction. A feedback signal from the output of the amplifier is constructed to provide a signal representing the difference between forward and reflected power which is compared in a multiplier with a signal representing current flow in the power amplifier to produce a control voltage for adjusting the supply voltage of transistors forming the power amplifier. Thereafter, if the load impedance changes, the supply voltage is also changed to minimize dissipation and maintain the efficiency of the amplifier substantially constant.

10 Claims, 3 Drawing Figures

4,547,746

VSWR TOLERANT LINEAR POWER AMPLIFIER

BACKGROUND OF THE INVENTION

The present invention relates to amplifiers and, more particularly, to high frequency power amplifiers utilized in systems requiring operation with variable load impedances.

In many present communications systems, especially high frequency systems, the output frequency is changed at fast or slow rates in order to provide frequency hopping for making the system more secure. In such systems, a power amplifier typically receives a modulated carrier frequency, which carrier frequency is then changed in accordance with the frequency hopping scheme. The output of the power amplifier is then coupled through an antenna matching device or directly to an antenna for transmission of the modulated carrier.

As will be appreciated, in order to provide the most efficient operation, there must be an impedance match between the power amplifier and the antenna or coupling network. When considering such things as reliability and noise generation in connection with the need to provide that impedance match, it is not desirable to mechanically or electrically alter the network, such as by use of a coupler, between the power amplifier and an antenna. Thus, the system should be constructed so that there is no such need for the change in the coupling network while still achieving broadband operation. However, use of a broadband antenna or antenna coupler combination at high frequencies cannot be expected to provide an impedance match better than 50 ohms within a VSWR of 2:1 or 2.5:1.

In any such systems where the power amplifier is designed to produce power output into a nominal 50 ohm load, but operates with VSWRs up to 2.1 or 2.5:1, there will be a decrease in efficiency. Specifically, at high load impedances, such an amplifier will tend to distort the amplified signal, while at low load impedances, the amplifier will tend to dissipate large amounts of power in the output of the amplifier, both of which are undesirable in system operation. In each instance, the problem arises because the supply voltage of the power amplifier (Vcc or Vdd) driving the power transistors is maintained constant in spite of the variations in the load impedance, thereby resulting in the decrease in efficiency or distortion of the amplified signal depending upon the variation in the load impedance. There is therefore a continuing need for amplifiers which are capable of operating in broadband applications having wide variations in load impedance.

Accordingly, the present invention has been developed to overcome the specific shortcomings of the above known and similar techniques and to provide an improved power amplifier system and technique for broadband, high frequency applications.

SUMMARY OF THE INVENTION

In accordance with the present invention, the output of an RF transistor power amplifier is coupled through a directional coupler to a load and the forward power and reflected power coupled through a comparator circuit to provide a difference which represents the true load power. Simultaneously, the input current of the RF power amplifier is sensed by a differential amplifier to provide a second signal which is compared with the true load power in an analog divider to produce a control voltage. The control voltage is coupled to control a variable voltage supply driving the supply voltage (Vcc or Vdd) of the transistors of the power amplifier. Thereafter, as the impedance varies at the load, the supply voltage is increased or decreased to accommodate the change at the load to thereby maintain the efficiency of the amplifier at a relatively constant value with a minimum dissipation over the range of amplifier operation. Such change in the supply voltage causes the power amplifier to match the load to prevent distortion at high load impedances and minimize dissipation at low load impedances.

It is therefore a feature of the invention to provide a power amplifier for broadband operation.

It is still another feature of the invention to provide a power amplifier which may be operated to match variable load impedances within a range of VSWR of 2:1 to 2.5:1.

Yet another feature of the invention is to provide a transistor power amplifier having a variable supply voltage operable to increase or decrease in accordance with an increase or decrease in the load impedance to provide broadband operation.

Still another feature of the invention is to provide a power amplifier feedback system which compares the signal representing load power with a signal representing amplifier input current to produce a control voltage for controlling the variable supply voltage of an RF power amplifier.

It is still another feature of the invention to provide a power amplifier having a variable supply voltage for matching variable output impedances in a frequency hopping system.

These and other advantages and novel features of the invention will become apparent from the following detailed description when considered with the accompanying drawings wherein:

DETAILED DESCRIPTION OF A PREFERRED EMBODIMENT

Figure 1:
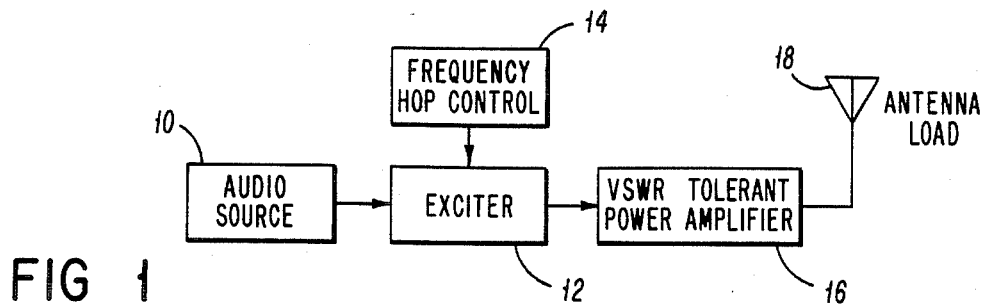
FIG. 1 is a block diagram broadly showing the system including the VSWR tolerant power amplifier in accordance with the present invention.

Referring now to the drawings, there is shown the system and technique for providing a VSWR tolerant power amplifier and system wherein like numerals are used to refer to like elements throughout. In FIG. 1 there is shown the broad schematic diagram of the use of a VSWR tolerant power amplifier 16 in connection with the transmission of an audio signal on a high frequency carrier which is frequency hopped for secure communications. In particular, the system includes an audio source 10 which may convert, for example, speech into a modulating signal which is applied to a carrier frequency in an exciter 12. The carrier frequency is changed in accordance with a specific pattern determined by a frequency hop control 14. The exciter (including a modulator) 12 modulates the carrier frequency set by control 14 to impress the audio signal 10 on the carrier frequency. The output of the exciter 12 is then coupled through a VSWR tolerant power amplifier 16 before being coupled to a broadband antenna for transmission at 18. Alternatively, the output from the VSWR tolerant power amplifier 16 could be coupled through a conventional broadband coupling network before being applied to the antenna 18.

As was noted above, the antenna impedance may change in accordance with frequency changes within a range of VSWR of 2:1 to 2.5:1. In such instances, a conventional power amplifier will produce inefficient and undesirable operation as the load impedance varies. In particular, for an increase in load impedance, the amplified signal will be distorted, while for a decrease in load impedance, the power amplifier will dissipate unnecessary power. This results because the power amplifier is not matched to the change in load conditions and the supply voltage of the conventional power amplifier is fixed. As a result, the efficiency of the amplifier is decreased and the dissipation increases depending on the load conditions.

In accordance with the present invention therefore, there is defined a system including the VSWR tolerant power amplifier 16 which enables the supply voltage of the power amplifier to be changed to match changes in impedance. The change in the amplifier operating conditions as the load VSWR changes causes a more efficient circuit operation as well as an undistorted output. The particular technique, although described in connection with an RF amplifier in a frequency hopping system, is equally applicable to amplifiers of any type including audio frequency amplifiers where efficient and linear operation is necessary or desired.

For purposes of description herein, the invention will be explained in connection with the use of a nominal load impedance of 50 ohms and a VSWR of 2:1, although it will be apparent that other load and VSWR ranges are applicable. By way of example, if the variation of load impedance is at a 2:1 VSWR based on a nominal 50 ohms, changes in load impedance can be shown by charting on a Smith chart to display the set of impedances corresponding to a given VSWR. The same will be defined by the well-known set of equations where the impedance Z is defined as:

$$Z = \frac{1+\Gamma}{1-\Gamma}(R_0) \quad (1)$$

$$|\Gamma| = \frac{S-1}{S+1} \quad (2)$$

where, $\Gamma$ is the reflection coefficient, Z is the load impedance (R+jX) and S is the voltage standing wave ratio (VSWR). Under perfectly matched conditions, $Z=R_0$, $\Gamma=0$ and $S=1$. Under totally mismatched conditions, $Z=0$ or $|Z|=\infty$, $|\Gamma|=1$ and $S=\infty$. Using well-known VSWR-impedance conversions (see, for example, Table 16-1 of the book entitled *Solid State Radio Engineering*, by Krauss, Bastian and Raab, published by John Wiley and Sons, 1980), the following equations may be used to find the VSWR of a given impedance:

$$\Gamma = \frac{Z-R_0}{Z+R_0} \quad (3)$$

$$S = \frac{|\Gamma|+1}{|\Gamma|-1} \quad (4)$$

As will be appreciated, the impedance of a VSWR load is transformed by the electric length of a transmission line to an impedance of the same VSWR. Therefore, the impedance of the load can be transformed to any impedance defined by equation (1) at the power amplifier due to the VSWR. In order to operate efficiently under such load VSWR variations, the power amplifier must change its operating conditions to match the load as presented at the output of the power amplifier.

Figure 2:
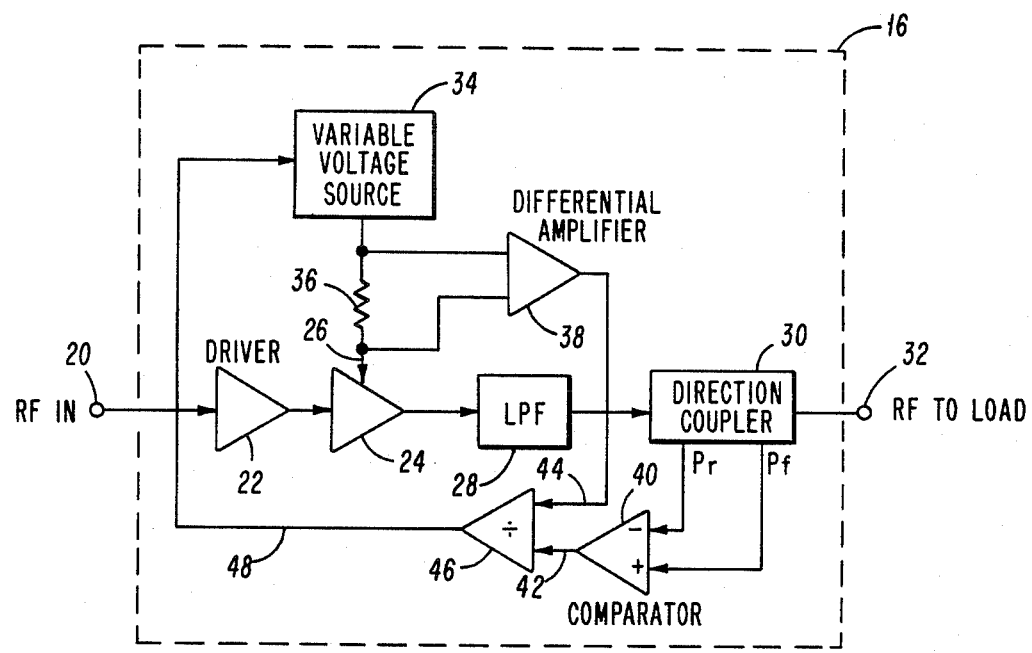
FIG. 2 is a detailed schematic diagram of the VSWR tolerant power amplifier shown in FIG. 1.

Referring now to FIG. 2, there is shown a more detailed description of the VSWR tolerant power amplifier 16 of FIG. 1. The RF input from exciter 12 is provided at terminal 20 and coupled through a conventional amplifier driver 22 to the input of a conventional power amplifier 24 having an input through line 26 representing the supply voltage. The output from the power amplifier 24 is in turn coupled to a lowpass filter 28 and thence to a directional coupler 30 providing an output 32 to the load, which in the present example is antenna 18. A variable voltage supply source 34 is coupled to provide a voltage (Vcc or Vdd) through a resistor 36 to line 26 to provide the supply voltage of power amplifier 24.

Figure 3:
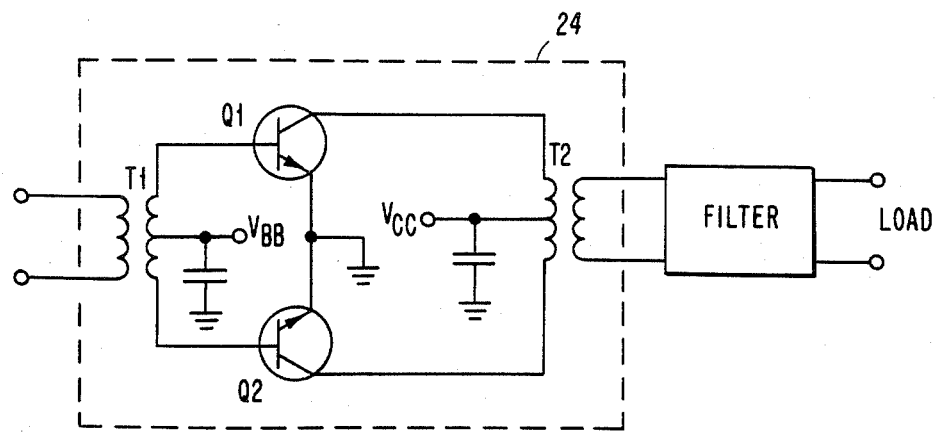
FIG. 3 is a more detailed diagram broadly showing a conventional power amplifier which may be used in accordance with the present invention.

Referring more particularly to FIG. 3, the power amplifier 24 may comprise a typical class AB (or B) amplifier having its input from the driver 22 to the primary of transformer T1 which has its secondary output coupled to the base of transistors Q1 and Q2. The emitters of transistors Q1 and Q2 are coupled in common to ground while the collectors are coupled through the primary of transformer T2. A voltage source Vbb is connected in a conventional manner to provide the base bias while the voltage source Vcc is coupled to provide the collector current. The secondary from the transformer T2 then provides the amplified output through the lowpass filter 28 before being coupled to a load, which in the present instance is the antenna 18 through the coupler 30.

Although the above power amplifier has been described with respect to conventional transistors employing a supply voltage for the collector Vcc, the same is equally applicable to other transistor amplifiers such as FETs having a supply voltage for the drain (Vdd). Likewise, since the power amplifier is of conventional construction, there will be no detailed explanation of the theory, bias and operation of the amplifier other than is necessary for its operation in accordance with the present invention.

Referring again to FIG. 2, in order to provide the variation in voltage for the supply voltage (Vcc or Vdd) from source 34, signals representing the output power and the supply current to the RF amplifier are employed. Specifically, analog samples of forward (Pf) and reflected (Pr) power and the RF amplifier output stage supply current (Idc) are obtained by use of the directional coupler 30 and the differential amplifier 38. The directional coupler 30 provides the reflected power Pr at one terminal and the forward power Pf at a second terminal. By utilizing the forward and reflected power, the load (as seen at the power amplifier) can be determined by comparing the true load power with the output stage collector or drain current. The true load power may be obtained by subtracting the reflected power Pr from the forward power Pf in comparator 40 to produce an output at 42 representing the true load power. Likewise, the output collector or drain current Idc to the power amplifier is sensed through resistor 36 by use of differential amplifier 38 having inputs coupled to both terminals of the resistor 36.

For a given true power Po where Po is to be maintained substantially constant and Po=Pf−Pr, a low current (Idc) represents a higher impedance power amplifier load and a high current represents a lower impedance power amplifier load. Thus, if the output stage operating voltage (Vcc or Vdd) is controlled by the comparison of true load power Po with output current Idc, then the power amplifier dissipation and efficiency can be maintained at or near optimum conditions where $\eta$ is efficiency and $$\eta = \frac{Po}{Pin} = \frac{(Pf - Pr)}{(Idc)(Vcc)}$$

Accordingly, the signal representing Idc on line 44 and the signal representing true power Po on line 42 is coupled to an analog divider 46 to provide an output signal on line 48 which is in turn coupled to the variable voltage source 34 to increase or decrease the supply voltage (Vcc or Vdd) in accordance with the increase or decrease in load resistance due to changing VSWR. For a class B or AB push-pull power amplifier having a given RF power output defined as:

$$Po = \frac{V^2}{2R} \quad (5)$$

(where V is the collector rf voltage and R is the nominal load impedance at the collector), and a load VSWR, S, the collector load impedance may vary from a maximum of $$Rmax = (R)(S) \quad (6)$$

to a minimum of $$Rmin = (R)/(S) \quad (7)$$

The collector RF voltage therefore may vary from $$Vmax = \sqrt{(2)(Rmax)(Po)} \quad (8)$$

$$Vmin = \sqrt{(2)(Rmin)(Po)} \quad (9)$$

with all other complex impedances resulting in V between Vmin and Vmax.

The supply voltage Vcc must be:

$$Vcc \geq V + Vsat \quad (10)$$

where Vsat is the transistor saturation voltage.

In a conventional power amplifier, Vcc≈V. Therefore at Rmax, Vcc is not greater than Vmax and severe distortion results. In the VSWR tolerant power amplifier, Vcc is adjusted so that Vcc=Vmax+Vsat.

By way of example, the efficiency of a power amplifier is:

$$\eta = \frac{Po}{Pin} = \frac{kV}{Vcc} = \frac{Pf - Pr}{(Idc)(Vcc)} \quad (11)$$

where
$\eta$ = efficiency
Po = power output
Pin = power input

V = collector rf voltage
Vcc = collector supply voltage
k = $\pi/4$ for a theoretically perfect power amplifier
Pf = forward power to load
Pr = reflected power from load
Pf−Pr = true power delivered to load
Idc = power supply current into power amplifier In a conventional power amplifier with fixed Vcc, with Rmin=(R)/(S), the resulting efficiency using equation (9) is:

$$\eta \min = \frac{Vmin}{Vcc} = \frac{V/(\sqrt{S})}{Vcc} = \frac{\eta}{\sqrt{S}} \quad (12)$$

This reduced efficiency results in excessive power amplifier dissipation, Pdiss, where:

$$Pdiss = Pin - Po \quad (13)$$

This may result in thermal overload and power amplifier destruction.

In a VSWR tolerant power amplifier, in accordance with the present invention, Vcc is adjusted so Vcc=V+Vsat and $\eta \approx$ constant.

Now, recalling that:

$$\eta = \frac{Po}{Pin} = \frac{Pf - Pr}{(Idc)(Vcc)}$$

The goal of the VSWR tolerant power amplifier is to adjust Vcc according to a specified load impedance, R, to maintain a substantially constant efficiency, $\eta$.

Rewriting the above equation yields:

$$Vcc = \frac{Pf - Pr}{(Idc)\eta} = \frac{Po}{(Idc)\eta}$$

In the embodiment described with respect to Fig. 2, Pf and Pr are provided by directional coupler 30, Po is provided by comparator 40, Idc is provided by differential amplifier 38, the division of Po/Idc is provided by the analog divider 46, and control of Vcc is provided by variable power supply 34. The resulting output signal on 48 thus controls the variable voltage source 34 to maintain linearity and substantially constant efficiency.

By way of example, let S=2, or a 2:1 VSWR. Then $$Rmin = R/2 \text{ and}$$

$$Rmax = 2R.$$

At Rmax, $$Vmax = \sqrt{(2)(2)(R)(Po)} = \sqrt{2} \, V.$$

For constant efficiency, this requires Vcc to increase by $\sqrt{2}$ and this is the result of Idc being smaller by $\sqrt{2}$.

At Rmin, $$Vmin = \sqrt{2(R/2)(Po)} = V/\sqrt{2}.$$

For constant efficiency, this requires Vcc to decrease by $\sqrt{2}$ and this is the result of Idc being larger by $\sqrt{2}$.

In contrast to the above, if the system is operated conventionally with a constant supply voltage, Vcc > Vmax = $\sqrt{2}$ V at Rmax and is held constant. Further, at Rmin, Idc is increased by $\sqrt{2}$ and:

$$\eta\text{-min} = \frac{Po}{(\sqrt{2}\ Idc)(\sqrt{2}\ Vcc)} = \frac{\eta}{2}$$

where
$\eta$ min = efficiency at Rmin,
$\eta$ = efficiency at nominal R
Idc = dc current at nominal R
Vcc = supply voltage at nominal R
The decrease in efficiency by half results in probable thermal overload due to over dissipation unless the design is appropriately oversized.

In accordance with the above description, it will be seen that the present invention produces an operation of a power amplifier circuit which makes the power amplifier tolerant to variations in loads which enable the system to be particularly useful in broadband applications. By comparing the true power analog output from a power amplifier with the supply current of the output stage of the power amplifier, a signal can be developed to control the supply voltage to maintain the linearity and efficiency of the amplifier. Thus, for an increase in the load impedance due to VSWR, the supply voltage is increased and for a decrease in load impedance, the supply voltage is decreased. This operation prevents amplifier distortion at high load impedances and decreases the dissipation for low load impedances. All of these are features which are not suggested or shown by any of the prior art and are applicable to a variety of amplifying systems.

An optional operation of the apparatus useful for slow frequency hopping systems is to perform the calculation of Vcc once for each hop at a specified power level (tune power). The voltage then calculated would be held constant at that frequency. Since the frequency is constant during the hop interval, the impedance would also be constant. For systems where the hopping rate is relatively slow (a few hops per second), this eases circuit requirements with regard to speed of operation and set-up time.

It should also be appreciated that the system operates to maintain a substantially constant efficiency for temperature variations which affect circuit operation. Thus, as a change in temperature causes the amplifier characteristics to change, the power output reflects those changes and causes an adjustment of the voltage supply in the manner shown in FIG. 2 to maintain efficiency.

Obviously, many other modifications and variations of the present invention are possible in light of the above teachings. It is therefore to be understood that within the scope of the appended claims, the invention may be practiced otherwise than as specifically described.

What is claimed is:
1. An amplifying system comprising:
an amplifier having an input, an output, and means for receiving a supply voltage;
a load coupled to the output of said amplifier;
means coupled between the output of said amplifier and said load for providing a signal representing power;
means coupled to sense current provided to said amplifier from said supply voltage to provide an output signal;
means for dividing said signal representing power by said output signal to provide a control signal; and
means responsive to said control signal for varying said supply voltage.

2. The system of claim 1 wherein said means for providing said signal representing power comprises a directional coupler having a first output representing reflected power and a second output representing forward power and a comparator means coupled to said first and second output for subtracting said reflected power from said forward power to provide said signal representing power.

3. In a broadband frequency hopping system having an audio source, a modulator responsive to said audio source for modulating a carrier frequency, a means for changing said carrier frequency in response to a frequency control, an amplifier for amplifying said carrier frequency, and an antenna coupled to transmit said amplified modulated carrier frequency, the improvement in said amplifier comprising:
an amplifier, having an input, output, and means for receiving a supply voltage;
a variable voltage supply coupled to said means for receiving a supply voltage;
a load coupled to the output of said amplifier;
means coupled between the output of said amplifier and said load for providing a signal representing power;
means coupled to sense current provided to said amplifier from said variable voltage supply to provide an output signal;
means for dividing said signal representing power by said output signal to provide a control signal; and
means responsive to said control signal for changing the voltage of said variable voltage supply.

4. The system of claim 3 wherein said means for changing the variable voltage is constructed and arranged to change said voltage in such a manner as to maintain a substantially constant efficiency of the amplifier in response to variations in the load.

5. The system of claim 3 wherein said means for changing the voltage increases the voltage in response to an increase in load impedance and decreases the voltage in response to a decrease in load impedance.

6. The system of claim 4 wherein said amplifier is a class AB transistor amplifier.

7. The system of claim 5 wherein said amplifier is a high power radio frequency amplifier.

8. The system of claim 1 wherein said means for sensing current comprises a differential amplifier.

9. An amplifying system comprising:
an amplifier having an input, an output, and means for receiving a supply voltage;
a load coupled to the output of said amplifier;
means coupled between the output of said amplifier and said load for providing a signal representing power;
means coupled to sense current provided to said amplifier from said supply voltage to provide an output signal and including a resistor coupled between said supply voltage and said amplifier, and a differential amplifier having first and second inputs coupled to terminals of said resistor to sense said current and provide said output signal;
means for dividing said signal representing power by said output signal to provide a control signal; and
means responsive to said control signal for varying said supply voltage.

10. In a broadband frequency hopping system having an audio source, a modulator responsive to said audio source for modulating a carrier frequency, a means for changing said carrier frequency in response to a frequency control, an amplifier for amplifying said carrier frequency, and an antenna coupled to transmit said amplified modulated carrier frequency, the improvement in said amplifier comprising:

an amplifier, having an input, output, and means for receiving a supply voltage;

a variable voltage supply coupled to said means for receiving a supply voltage;

a load coupled to the output of said amplifier; and means responsive to a variation of said load for changing the voltage of said variable voltage supply, said means for changing the voltage comprising a directional coupler coupled between the output of said amplifier and the load and having first and second outputs representing forward power and reflected power, means for subtracting reflected power from forward power to provide a power signal, means for sensing current provided from said variable voltage supply to said amplifier and providing an output signal, and means for dividing said power signal by said output signal to provide a control voltage for changing the voltage of said variable voltage supply.

* * * * *